United States Patent [19]
Cooper

[11] Patent Number: 5,349,302
[45] Date of Patent: Sep. 20, 1994

[54] SENSE AMPLIFIER INPUT STAGE FOR SINGLE ARRAY MEMORY

[75] Inventor: Lavon K. Cooper, Mound, Minn.

[73] Assignee: Honeywell Inc., Minneapolis, Minn.

[21] Appl. No.: 61,603

[22] Filed: May 13, 1993

[51] Int. Cl.$^5$ ............................................. G11C 11/40
[52] U.S. Cl. ............................... 365/207; 365/230.01
[58] Field of Search ................... 365/230.01, 189.01, 365/8, 149, 207, 208

[56] References Cited

U.S. PATENT DOCUMENTS

| | | | |
|---|---|---|---|
| 4,669,065 | 5/1987 | Ohsawa | 365/210 |
| 4,722,073 | 1/1988 | Lampe et al. | 365/87 |
| 4,829,476 | 5/1989 | Dupuis et al. | 365/158 |
| 5,117,394 | 5/1992 | Amin et al. | 365/203 |
| 5,148,063 | 9/1992 | Hotta | 307/530 |

Primary Examiner—Terrell W. Fears
Attorney, Agent, or Firm—Gregory A. Bruns

[57] ABSTRACT

Sense amplifier input stage for reading the output of a single array memory having an "unknown" output, a reference "one" output and a reference "zero" output. A first differential amplifier compares the "unknown" output to the reference "one" output, and a second differential amplifier compares the unknown output to a reference zero output. The first and second differential amplifier share the same load Y resistors. Voltage offsets arising in the memory and in the sense amplifier input stage are compensated before the comparisons are made. When the unknown is a one the output has a first polarity and when the unknown is a zero, the output has an opposite polarity.

14 Claims, 3 Drawing Sheets

SENSE AMPLIFIER INPUT STAGE FOR SINGLE ARRAY MEMORY

BACKGROUND OF THE INVENTION

The Government has rights in this invention pursuant to Contract No. 87F345500 awarded by the department of the Air Force.

The present invention relates generally to sense amplifiers for memory devices and specifically to a sense amplifier input stage for a single array memory.

Digital memories of various kinds are used extensively in computers and computer system components, in digital processing systems and the like. One such kind of memory can be formed, to considerable advantage, based on the storage of digital bits as alternative states of magnetization in magnetic materials in each memory cell, typically thin film materials. In ferromagnetic thin film memories the states of the memory cells based on magnetization direction are determined through magnetoresistive properties of the thin film sensed by an electronic circuit. In memory device technology such as magnetoresistive memory devices, the memory devices operate at very low signal levels. Due to the very low signal levels available, complementary memory array techniques are frequently used. The complementary memory array approach of course requires additional semiconductor space, complex additional circuitry and additional power. Thus a need exists for a sense amplifier input stage that will reliably operate at the very low signal level available from a memory device such as a single array magnetoresistive memory.

SUMMARY OF THE INVENTION

The present invention solves these and other needs by providing a sense amplifier input stage for use with a single array memory having an "unknown" output, a reference "one" output and a reference "zero" output. A first differential amplifier compares the unknown output to the reference one output, and a second differential amplifier compares the unknown output to a reference zero output. The first and second differential amplifiers share the same load resistors with the output of the sense amplifier input stage taken between the load resistors. Voltage offsets due to differences existing in the construction of the memory cells and due to offsets internal to the differential amplifiers are compensated by using balancing voltages before the comparisons described are made. To make the comparison, means are provided for momentarily introducing the unknown output, the reference one output and the reference zero output simultaneously. When the unknown is a "one" there is no output from the first differential amplifier, but there is an output of a certain polarity from the second differential amplifier due to the mismatch of the inputs. When the unknown is a "zero" there is an output of the opposite polarity from the first differential amplifier due to the mismatch, but there is no output from the second differential amplifier. A third differential amplifier compares the reference one output to the reference zero output. The third differential amplifier does not provide a useful output but does provide a totally balanced loading arrangement for the single array memory.

DETAILED DESCRIPTION

Figure 1:
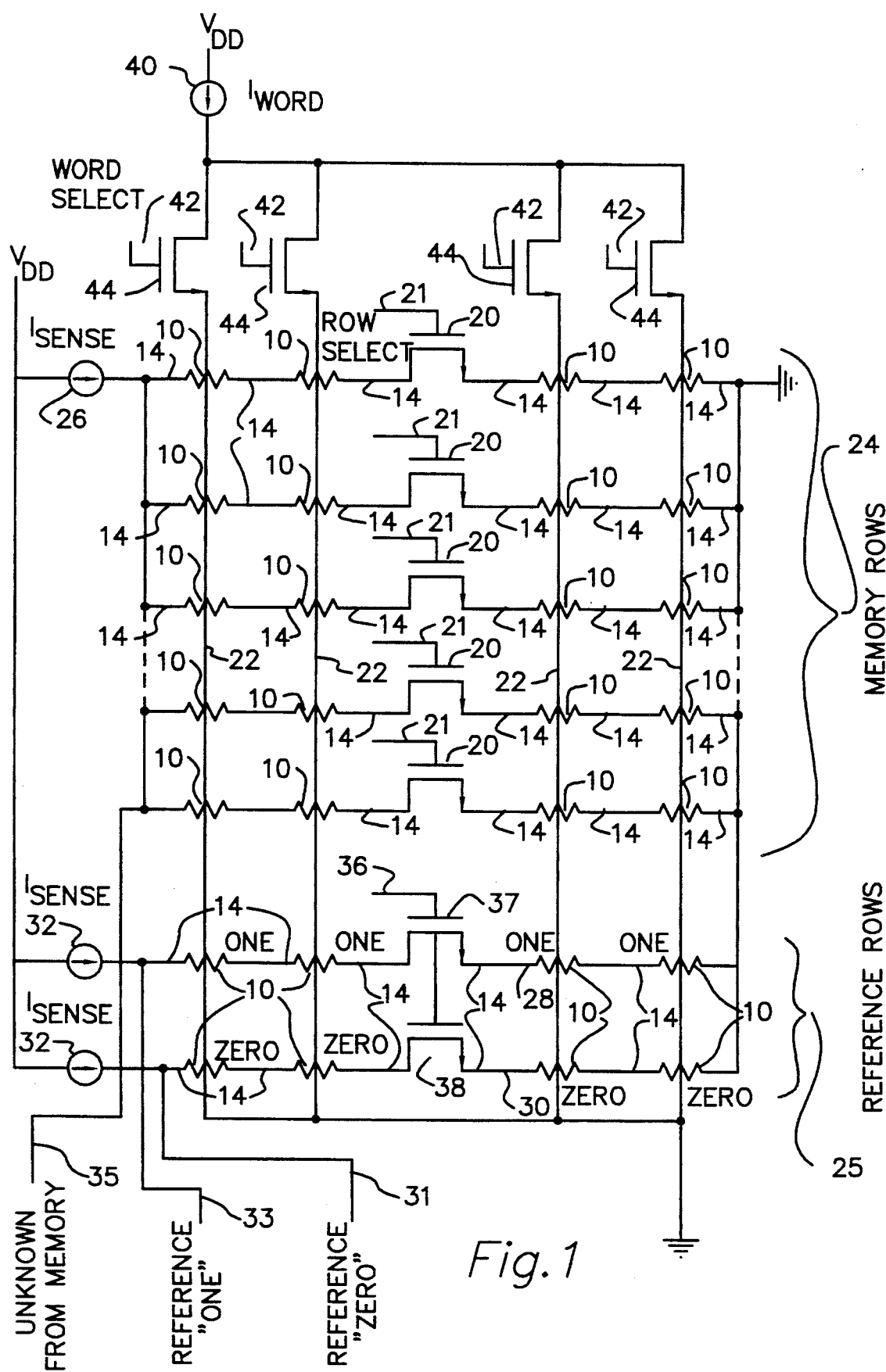
FIG. 1 is a partial system diagram of a single array memory for use with the present invention.

A sense amplifier input stage for use with a single array memory is shown in the drawings and generally designated 50. Input stage 50 is described in relation to its use with a magnetoresistive type single array memory. It is to be understood however that the present invention may be used with other memory technologies and is not limited to the magnetoresistive type memory. The details of the construction of a magnetic bit structure 10, which could be used to construct a single array memory for use with the present invention, are explained in U.S. Pat. No. 4,829,476 dated May 9, 1989 which is hereby incorporated by reference.

FIG. 1 is a partial schematic diagram for a magnetoresistive memory array showing the array of bit structures 10, in part, and portions of the associated switching circuitry. Repeated portions of each are omitted, as shown in the breaks in the circuit in FIG. 1. Bit structures 10 are arranged with four of them in series with one another to form a series string of them, and this series arrangement is repeated N times to reach the desired number of memory elements in the array. Row select transistors 20 have their source and drain connections in series with the bit structures 10 of a single memory row. Bit structures 10 are joined in series at terminal regions, or junctures, 14 to one another, to row select transistor 20 or to the associated circuitry for those bit structures at the end of the series string. Word lines 22 are drawn over bit structures 10 which are represented as resistors to provide the schematic equivalent of the bit structure 10. That portion of the memory array that can be used for storing and reading data is designated as memory rows 24 in FIG. 1. Current generator 26 is arranged in a way that is well known and is not shown or described here, wherein generator 26 is only connected to a single row within the memory rows 24 at any one time. The present invention requires a signal representative of a "one" memory state and a signal representative of a "zero" memory state. The following describes one method of providing these reference "one" and reference "zero" signals in connection with a magnetoresistive memory through the use of reference rows 25. Other methods could be used with magnetoresistive memory and other methods could be used with other memory technologies. Reference select line 36 controls reference "one" row transistor 37 and reference "zero" row transistor 38. The single array memory of FIG. 1 also includes a reference "one" row 28 and a reference "zero" row 30. Current generator 32 is arranged so that when it is active it always supplies sense current to "reference one" row 28. Current generator 34 is arranged so that when it is active it always supplies sense current to "zero" reference row 30. Reference select line 36 controls reference "one" row transistor 37 and reference "zero" row transistor 38. One way to generate the reference "one" and reference "zero" bits is to use current source 32 and word current source 40 to write all bits in row 28 to "one" and to use current source 34 and word current source 40 to write all bits in row 30 to "zero". The single array memory of FIG. 1 provides an "unknown" signal 35, a reference "one" signal 33 and a reference "zero" signal 31 to sense amplifier input stage 50.

Figure 2:
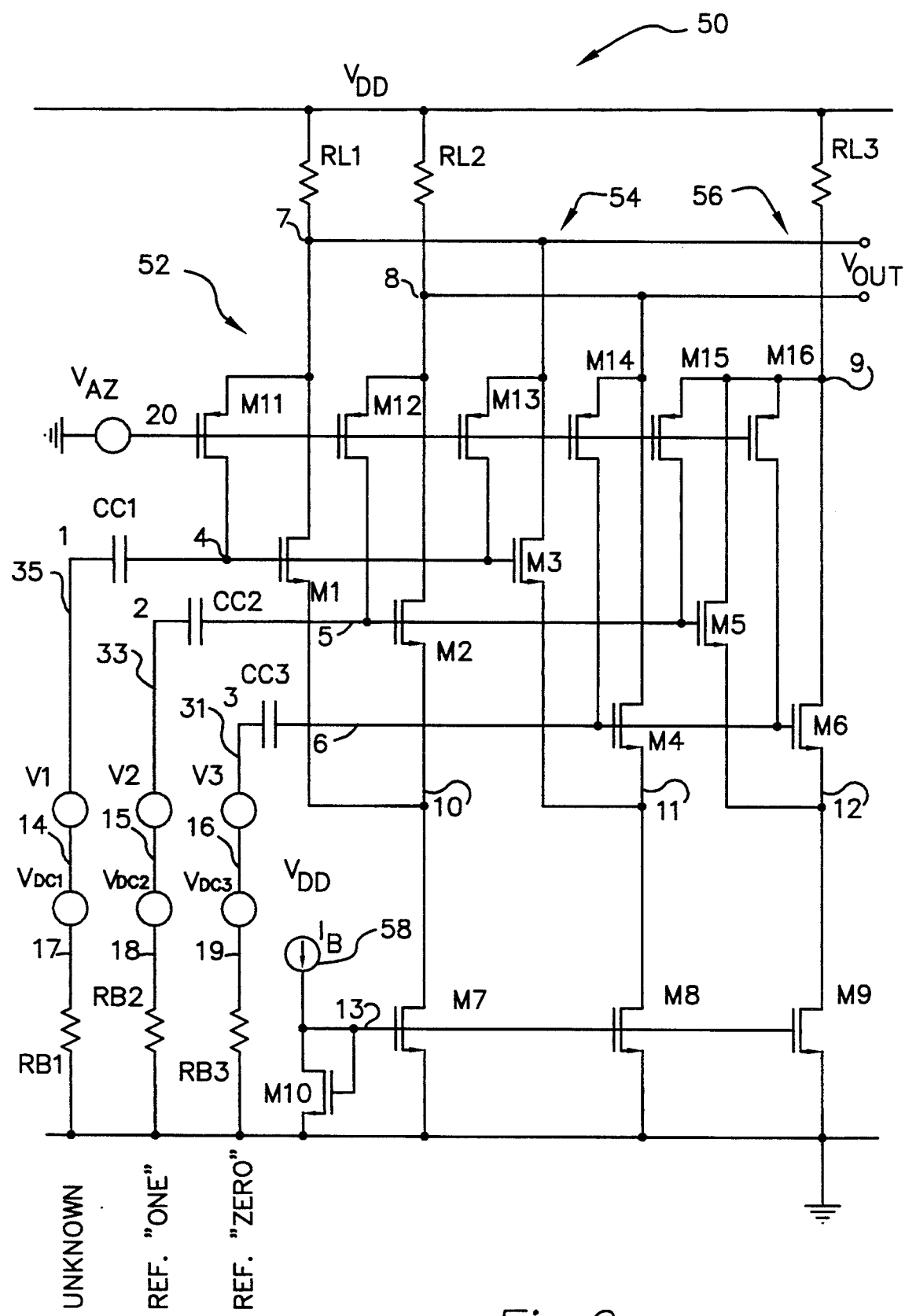
FIG. 2 is a schematic diagram of a sense amplifier input stage according to the teachings of the present invention.

The sense amplifier of the present invention includes differential amplifier 52, 54 and 56. Each differential amplifier includes a differential amplifier pair. As shown in FIG. 2 they are N channel MOSFET transistor pairs M1-M2, M3-M4, and M5-M6. The three differential pairs are biased by an arrangement that includes MOS transistors M7, M8, and M9. Constant current generator 58 supplies a constant current through MOS transistor M10 which has its gate connected to the drain and functions as a diode connected between current source 58 and ground. M10 establishes a constant voltage at node 13. The voltage at node 13 is connected to the gates of MOS transistors M7, M8, and M9 which establishes constant currents in each of MOS pairs M1-M2, M3-M4, and M5-M6 respectively. Load resistor RL1 is connected between Vdd and the drains of both M1 and M3. Load resistor RL2 is connected between Vdd and the drains of both transistors M2 and M4. The output of the input stage of sense amplifier, $V_{out}$ is taken between node 7 and node 8.

Each of MOS transistors M1 through M6 has an associated auto-zero transistor M11 through M16 respectively. M11 through M16 are shown in FIG. 2 as enhancement p-channel MOS transistors connected between the drain and the gate of the associated n-channel MOS transistor that is one transistor of a differential pair previously described. Thus for example auto-zero transistor M11 has its source connected to the drain of transistor M1. Auto-zero transistors M11 through M16 are all controlled by voltage $V_{az}$ which is connected to the gates of each of transistors M11 through M16. Therefore for example, when transistor M11 is "on", the drain of transistor M1 is connected to the gate of transistor M1.

The inputs to each of MOS transistor differential pairs M1-M2, M3-M4, and M5-M6 will be described next. For purposes of explaining a read cycle, assume that current sources 26, 32 and 34 shown in FIG. 1 have been turned "on" simultaneously. This would be accomplished by switching uppermost row select line 21 to a high state turning on transistor 20 and simultaneously switching reference select line 36 to a high state which turns on reference row transistor 37 and reference zero row transistor 38. As a result of the three current sources being turned on, each of the three sense amplifier input lines i.e. the "unknown", the reference "one", and the reference "zero" inputs would receive a signal which is a rising transient voltage which settles to a steady state after the capacitances on the rows have been charged by the sense currents. Each of the three signals will be approximately equal. The steady state voltages due to current sources 26, 32 and 34 are represented by $V_{DC1}$, $V_{DC2}$, and $V_{DC3}$. After the three sense currents have settled to steady state levels, $V_{DC1}$ represents the voltage across the uppermost row of bit structures 10. $V_{DC2}$ represents the voltage across the reference "one" row of bit structures 10. $V_{DC3}$ represents the voltage across the "zero" row of bit structures 10.

Voltages $V_{DC1}$, $V_{DC2}$, and $V_{DC3}$, will differ slightly because of offsets or differences external to the sense amplifier including differences in the bit resistances of the uppermost row, the reference "one" row, and the reference "zero" row; differences in the $V_{DS}$ of the transistors within the rows; and differences in current sources 26, 32, and 34. The auto-zero function will be activated by turning on auto-zero transistors M11 through M16 with a voltage pulse $V_{AZ}$ during the time voltages $V_{DC1}$, $V_{DC2}$, and $V_{DC3}$, are settling to their steady state values. The three inputs to the sense amplifier are through coupling capacitors CC1, CC2, and CC3. The auto-zero action will result in voltages being stored across each of coupling capacitors CC1, CC2, and CC3 which will null out differences in $V_{DC1}$, $V_{DC2}$, and $V_{DC3}$ respectively. In addition to the external offsets just described there are offsets generated internal to the sense amplifier due to differences between load resistors RL1 and RL2, and differences between the transistors of each of individual differential pairs M1-M2, M3-M4, and M5-M6. The auto-zero function will result in voltages being stored on coupling capacitors CC1, CC2, and CC3 which will null out some of these internally generated offsets. After the sense currents from current sources 26, 32 and 34 have settled to their final values, auto-zero voltage $V_{AZ}$ is turned off, storing the composite or combined offsets as voltage differences across coupling capacitors CC1, CC1, and CC3.

Resistors RB1, RB2, and RB3 represent the output resistance of the uppermost row of bit structures, the reference "one" row and the reference "zero" row respectively.

After the three sense currents have settled to steady state levels, word current source 40 would be turned on momentarily by switching the leftmost word select line 42 to a high state, thereby turning on transistor 44. Word current source 40 is shared in common with memory rows 24 and reference rows 25. This would cause word current across the leftmost bit of all memory rows including the selected memory row, the leftmost bit of the "one" reference row and the leftmost bit of the "zero" reference row. The word current will cause all bits under the word current line to momentarily increase resistance slightly, thereby generating a small voltage pulse on each of the three sense amp input lines. These voltage pulses are represented in FIG. 2 as $V_1$ for the "unknown" input, $V_2$ for the reference "one" input, and $V_3$ for the reference "zero" input. Those bits with "ones" stored would have a resistance change that is different in magnitude from bits with "zeros" stored. Therefore, the input voltage pulses $V_1$, $V_2$, and $V_3$ from rows with "ones" stored will be different in amplitude from the input voltage pulses from rows with "zeros" stored.

The pulse on the "unknown" signal line from the memory row whose logic state is unknown would be approximately the same amplitude as the pulse from either the reference "one" row or the reference "zero" row. Differential pair M1-M2 of differential amplifier 52 will compare the "unknown pulse" $V_1$ to the reference "one pulse" $V_2$ and the resulting drain current difference will cause an output voltage difference across load resistors RL1 and RL2. Simultaneously differential pair M3-M4 of differential amplifier 54 will compare the "unknown pulse" $V_1$ to the reference "zero pulse" $V_3$ and the resulting drain current difference will also cause an output voltage difference across load resistors RL1 and RL2 because differential pairs M1-M2 and M3-M4 share the same load resistors. Since unknown pulse $V_1$ will be approximately equal to one of the "reference" pulses, one of differential pairs M1-M2 or M3-M4 will always be approximately balanced or matched and the other will be unbalanced during the word current stimulated pulses $V_1$, $V_2$, and $V_3$. The sharing of the load resistors RL1 and RL2 between differential pairs M1-M2 and M3-M4 results in an analog type logic "anding" of the output signals from the dual comparison of input pulses. If unknown pulse $V_1$ is from a bit having a "one" stored then differential pair M1-M2 will be balanced and differential pair M3-M4 will be unbalanced resulting in an output voltage having a first polarity. If unknown pulse $V_1$ is from a bit having a "zero" stored then differential pair M1-M2 will be unbalanced and differential pair M3-M4 will be balanced resulting in an output voltage having a polarity opposite the first polarity. Therefore the resulting output voltage swing $V_{out}$ will be in opposite directions for the two cases giving a single output signal whose differential polarity, with respect to the quiescent state, indicates whether the "unknown" pulse was from a "one state" bit or from a "zero state" bit. In addition, the use of the dual comparator gives a full "one pulse.

Differential pair M5-M6 of differential amplifier 56 will always have reference "one" and reference "zero" as an input. The drains of M5 and M6 are both connected to load resistor RL3. No useful output is provided across RL3. Differential pair M5-M6 is included to balance the loading at the three input lines.

Figure 3:
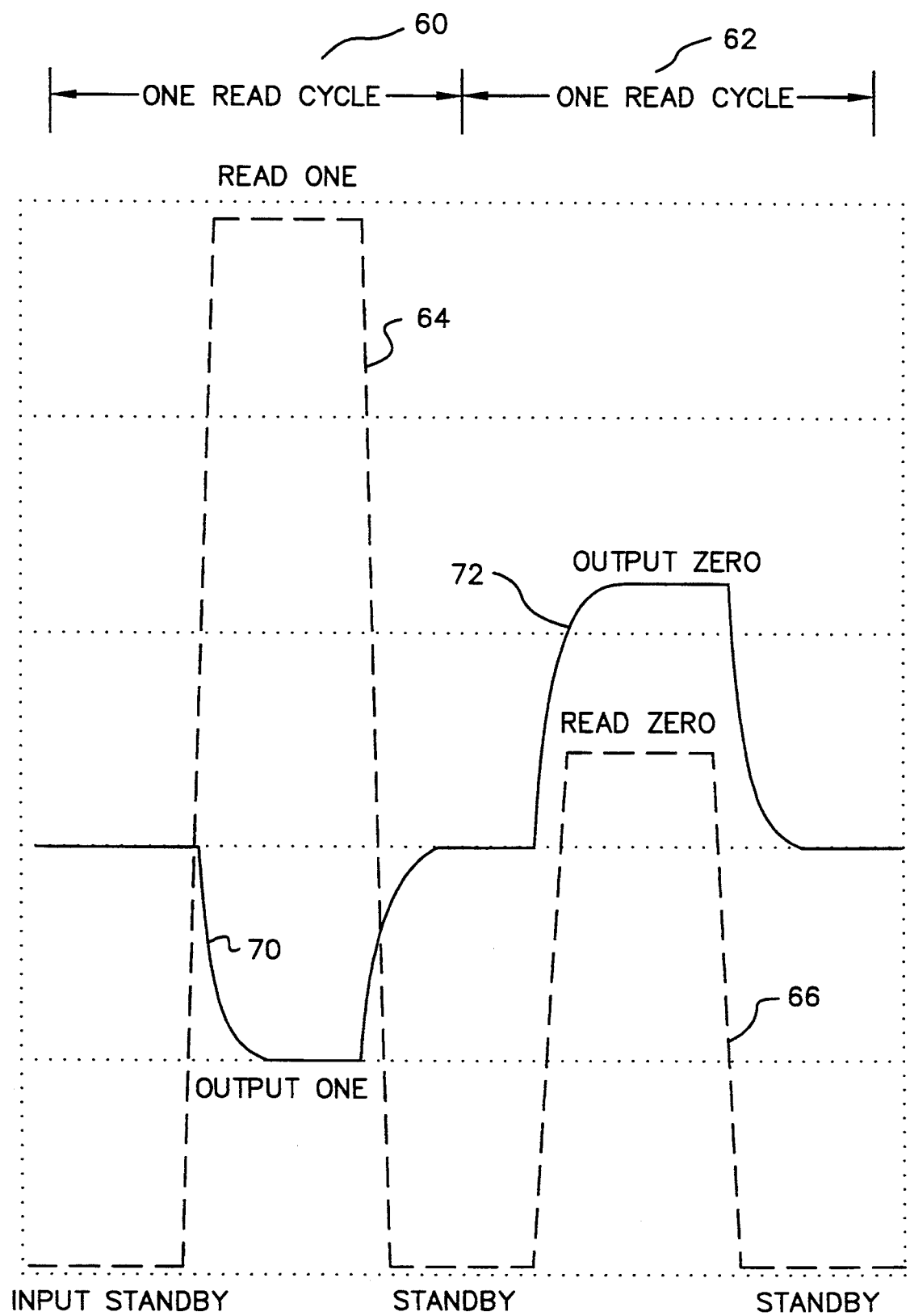
FIG. 3 is an illustration of certain waveforms encountered in the operation of the present invention.

For purposes of illustrating the present invention, assume that a "one" memory state in a bit structure 10 results in a greater resistance change due to a momentary word current than the resistance change that results when the memory state is a "zero". From this assumption it follows that the momentary word current will result in a greater voltage change across bit structure 10 or a higher voltage for a "one" than for a "zero". This is illustrated in FIG. 3 where a read cycle 60 is shown for an unknown input of a "one" and a read cycle 62 is shown for an unknown input of a "zero". The voltage pulse 64 due to the momentary word current when reading a "one" is shown as a higher voltage pulse that the voltage pulse 66 due to the momentary word current when reading a "zero". For example, assume the memory state of the selected "unknown" bit structure 10 is a "one". As a result of the word current being momentarily turned on there will be no output from differential pair M1-M2 because the signals at node 4 and node 5 i.e. V1 and V2 are matched. With regard to differential pair M3-M4, the gate of transistor M3 will be higher than the gate of transistor M4, so the drain of M3 will be lower than the drain of M4 and pulse 70 will be output between node 7 and node 8. In the situation when the memory state of the selected unknown bit structure 10 is a "zero", there will be no output from differential pair M3-M4 because the signals at node 4 and node 6 i.e. V1 and V3 are equal. However with regard to differential pair M1-M2, the gate of M1 will be lower than the gate of M2, so the drain of transistor M1 will be higher than the drain of transistor M2 and positive polarity pulse 72 will be output between node 7 and node 8.

Now that the construction and operation of the sense amplifier input stage 50 have been set forth, certain advantages can be set forth and appreciated. In the past the very low signal levels available from certain memory technologies have not permitted the use of single array memory. With certain of these technologies it has been necessary to use a complementary memory design approach. The complementary memory design requires additional semiconductor space, additional circuitry and additional power. Applicant's invention will make a single array memory design approach feasible for low signal level memory technologies.

An additional advantage is that sense amplifier input stage 50 compares a full amplitude unknown signal to a full amplitude reference signal to provide a bi-directional output signal. In the past certain circuits have been proposed which compared the unknown signal to a half amplitude signal in order to get a bi-directional output. Comparison circuits which utilize half amplitude signal are only half as sensitive as input stage 50. The use of the dual comparator of the present invention provides a full "one pulse" to "zero pulse" comparison in one or the other of the differential amplifier pairs M1-M2 or M3-M4. The resulting sensitivity should be approximately the same as the sensitivity when reading from memories with dual bit arrays and complementary bit storage.

The present invention also offers advantages in simplicity and ease of implementation. The six transistors of the three differential pairs are identical and the current biasing transistors M7, M8 and M9 are identical as are the six auto sensing transistors and the three coupling capacitors. Therefore input stage 50 is a totally balanced stage with three-way symmetry. Each of the three input signals drives two differential pair gates and each of the three input gate lines is auto-zeroed by two auto-zero switch transistors for a three way, mutual auto zeroing effect. Each load resistor carries current from two differential amplifier pair drains.

In accordance with the foregoing description, Applicant has developed a sense amplifier input stage for use with a single array memory having a very low output signal level. Applicant's input stage arrangement is easily incorporated into the design of memory devices. Although a specific embodiment of the Applicant's sense amplifier input stage is shown and described for illustrative purposes, a number of variations and modifications will be apparent to those of ordinary skill in the relevant arts. It is not intended that coverage be limited to the disclosed embodiment, but only by the terms of the following claims.

I claim:

1. A sense amplifier input stage for single array memory, comprising:
    a first reference line coupled to a first reference signal representing a first memory state;
    a second reference line coupled to a second reference signal representing a second memory state;
    an unknown line coupled to an unknown signal representing an unknown memory state;
    a first differential amplifier having a first input coupled to said unknown line and a second input coupled to said first reference line, said first differential amplifier having a first output connected to said first load and a second output load connected to said second load;
    a second differential amplifier having a first input coupled to said unknown line and a second input coupled to said second reference line, said second differential amplifier having a first output lead connected to said first load and a second output lead connected to said second load;
    means for compensating for offset voltages existing within said single array memory and within said sense amplifier input stage; and
    means for momentarily introducing said unknown signal, said first reference signal, and said second reference signal simultaneously to cause an output of said input stage between said first load and said second load, said output having a first polarity when said unknown signal corresponds to said first reference signal and a second polarity when said unknown signal corresponds to said second reference signal.

2. Sense amplifier input stage of claim 1 wherein said means for compensating for offset voltages comprises:
 zeroing means for said first and second differential amplifiers; and
 balancing voltage means for nulling said offset voltages.

3. Sense amplifier input stage of claim 2 wherein each said differential amplifier comprise a first and a second transistor and said zeroing means is applied to each said transistor and removed from each said transistor before said unknown signal, said first reference signal and said second reference signal are introduced.

4. Sense amplifier input stage of claim 3 wherein said balancing voltage means comprises a first storage means located in said first reference line, a second storage means located in said second reference line and a third storage means located in said unknown line, with said first, second and third storage means for storing voltages which null said offset voltages prior to a memory read cycle.

5. Sense amplifier input stage of claim 4 wherein said first, second and third storage means comprise capacitors.

6. Sense amplifier input stage of claim 5 wherein said single array memory comprises:
 magnetoresistive storage sites arranged into a first reference row, a second reference row, and at least one unknown row, with said storage sites within said rows connected in series;
 means for simultaneously providing sense currents through said rows;
 a plurality of word current means extending over said storage sites; and
 means for momentarily activating a selected word current means to provide said first reference signal, said second reference signal and said unknown signal.

7. Sense amplifier input stage of claim 2 further comprising a third differential amplifier having a first input coupled to said first reference line and a second input coupled to said second reference line, said third differential amplifier having a first output lead connected to a third load and a second output lead connected to said third load, said third differential amplifier providing a balanced input to said sense amplifier input stage.

8. Sense amplifier input stage of claim 6 further comprising a third differential amplifier having a first input coupled to said first reference line and a second input coupled to said second reference line, said third differential amplifier having a first output lead connected to a third load and a second output lead connected to said third load, said third differential amplifier providing a balanced input to said sense amplifier input stage.

9. A sense amplifier input stage for single array memory, comprising:
 an unknown line coupled to an unknown signal representing an unknown memory state;
 a first reference line coupled to a first reference signal representing a first known memory state;
 a second reference line coupled to a second reference signal representing a second known memory state;
 a first differential amplifier having a first input coupled to said unknown line and a second input coupled to said first reference line, said first differential amplifier having a first output lead connected to a first load and a second output lead connected to a second load;
 a second differential amplifier having a first input coupled to said unknown line and a second input coupled to said second reference line, said second differential amplifier having a first output lead connected to said first load and a second output lead connected to said second load;
 a third differential amplifier having a first input coupled to said first reference line and a second input coupled to said second reference line, said third differential amplifier having a first output lead connected to a third load and a second output lead connected to said third load;
 means for compensating for offset voltages existing within said single array memory and within said first, second, and third differential amplifiers; and
 means for momentarily introducing said unknown signal, said first reference signal and said second reference signal simultaneously to cause an output of said input stage between said first load and said second load, said output having a first polarity when said unknown signal corresponds to said first reference signal and a second polarity when said unknown signal corresponds to said second reference signal.

10. Sense amplifier input stage of claim 1 wherein said means for compensating for offset voltages comprises:
 auto-zeroing means for said first, second and third differential amplifiers; and
 balancing voltage means for nulling said offset voltages.

11. Sense amplifier input stage of claim 10 wherein each said differential amplifier comprise a first and a second transistor and said zeroing means is applied to each said transistor and removed from each said transistor before said unknown signal, said first reference signal and said second reference signal are introduced.

12. Sense amplifier of claim 11 wherein said single array memory is a magnetoresistive single array memory, and said first reference line is coupled to a reference "one" row having a first current source, said second reference line is coupled to a reference "zero" row having a second current source, and said unknown line is coupled to a selected "unknown" row having a third current source.

13. Sense amplifier of claim 12 wherein said means for compensating for offset voltages includes:
 first voltage storing means located in said first reference line;
 second voltage storage means located in said second reference line;
 third voltage storage means located in said unknown line;
 means for simultaneously activating said first, second and third current sources;
 means for activating said auto-zeroing means during rising transient currents from said first second and third current sources; and
 means for deactivating said auto-zeroing means after said transient currents have settled, with said balancing voltages stored on said first, second and third voltage storage means.

14. Sense amplifier input stage of claim 13 wherein said first, second and third storage means comprise capacitors.

* * * * *